US006098257A

United States Patent [19]

Koido et al.

[11] Patent Number: 6,098,257

[45] **Date of Patent: *Aug. 8, 2000**

[54] METHOD OF MANUFACTURING A PRINT HEAD FOR USE WITH AN INK JET PRINTER

[75] Inventors: Shigenori Koido; Mitsuru Kishimoto; Noboru Ooishi; Masahiko Shimosugi; Kiyoshi Ikeda, all of Tokyo, Japan

[73] Assignee: Oki Data Corporation, Tokyo, Japan

[ * ] Notice: Under 35 U.S.C. 154(b), the term of this patent shall be extended for 116 days.

[21] Appl. No.: 08/654,371

[22] Filed: May 28, 1996

[30] Foreign Application Priority Data

May 30, 1995 [JP] Japan .................................... 7-131416

[51] Int. Cl.[7] .................................................... H01L 41/22

[52] U.S. Cl. ........................................... 29/25.35; 427/282

[58] Field of Search ............................... 29/25.35, 890.1, 29/611; 427/282; 156/292; 101/129, 127

[56] References Cited

U.S. PATENT DOCUMENTS

| | | | |
|---|---|---|---|
| 4,937,097 | 6/1990 | Ichinose et al. | 427/282 X |
| 4,953,460 | 9/1990 | Wojcik | 101/129 |
| 5,046,415 | 9/1991 | Oates | 101/129 |
| 5,254,362 | 10/1993 | Shaffer et al. | 427/282 X |
| 5,266,964 | 11/1993 | Takahashi et al. | 29/890.1 X |
| 5,460,316 | 10/1995 | Hefele | 427/282 X |
| 5,478,700 | 12/1995 | Gaynes et al. | 427/282 X |
| 5,553,538 | 9/1996 | Freitag | 101/129 X |
| 5,593,080 | 1/1997 | Teshima et al. | 29/840 X |
| 5,650,810 | 7/1997 | Muto | 29/25.35 X |

FOREIGN PATENT DOCUMENTS

| | | | |
|---|---|---|---|
| 2-102056 | 4/1990 | Japan | 29/890.1 |
| 5-162318 | 6/1993 | Japan | 29/890.1 |

OTHER PUBLICATIONS

Balents, Leon Martin, A Metal Mask Ans Screen Assembly for Printing Thick–Films Onto Substrates Having Micro-miniature Devices Mounted Thereon, RCA Technical Notes, Sep. 1974.

*Primary Examiner*—S. Thomas Hughes
*Attorney, Agent, or Firm*—Robin & Champagne, PC

[57] ABSTRACT

A method of manufacturing a print head is for use with an ink Jet printer. The print head includes a plurality of parallel ink pressure chambers defined by a plurality of walls and a cover bonded on the top surfaces of the walls. The method includes the steps of forming a plurality of parallel grooves in a piezoelectric element, the grooves being bounded by a plurality of parallel walls aligned in a row; and applying an adhesive either to the top surfaces of the walls or to a surface of a cover in registration with top surfaces of the walls, the adhesive being applied by screen printing, the adhesive being applied by moving a squeegee in a direction perpendicular to a direction in which the grooves extend.

7 Claims, 12 Drawing Sheets

FIG.9A
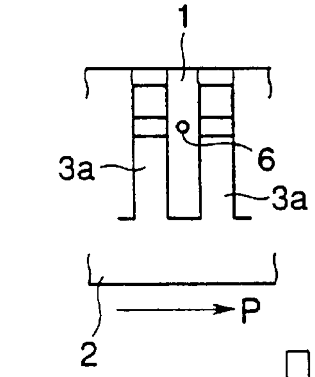
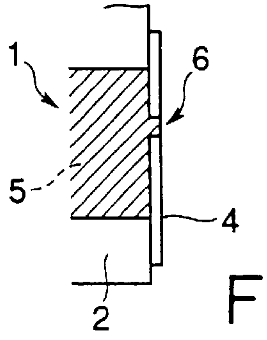
FIG.9E
FIG.9B
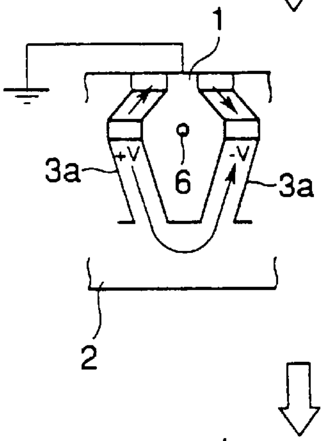
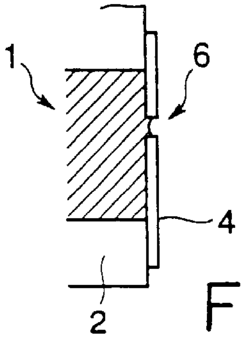
FIG.9F
FIG.9C
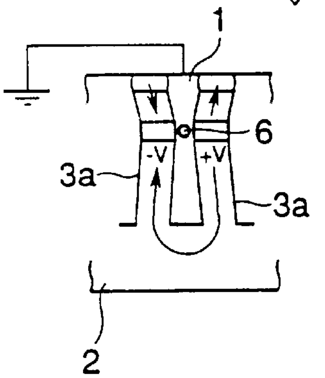
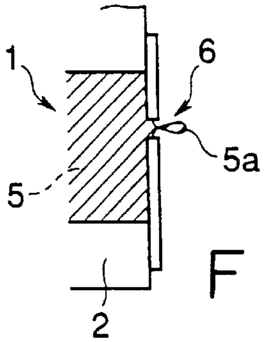
FIG.9G
FIG.9D
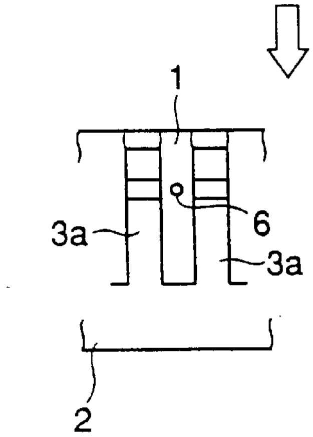
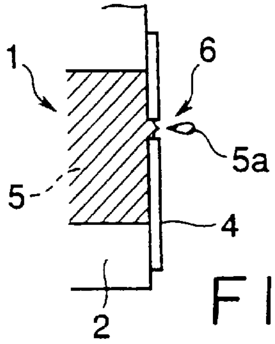
FIG.9H

METHOD OF MANUFACTURING A PRINT HEAD FOR USE WITH AN INK JET PRINTER

BACKGROUND OF THE INVENTION

The present invention relates to a method of manufacturing a print head for use with an ink jet printer.

One prior art print head for use with an ink jet printer is of a piezoelectric type in which a drop of ink is ejected out by an increased pressure in an ink pressure chamber developed when the piezoelectric element is deformed. To make the print head, a piezoelectric element having two layers is formed with a plurality of grooves therein, each of which serves as an ink pressure chamber. Then, an adhesive is applied by screen printing to the top surfaces of the walls bounding the pressure chambers, and then a cover is placed on the surfaces of the walls. The cover closes the respective grooves to form ink pressure chambers.

This type of ink pressure chamber operates as follows:

As shown in FIG. 9A, each ink pressure chamber is defined by adjacent two walls 3*a* which are formed when a plurality of grooves are formed in the two-layer piezoelectric element 2. The chamber 1 is closed at its front by a nozzle plate 4. The nozzle plate 4 has a nozzle hole 6 through which ink 5 is ejected out from the chamber 1. The piezoelectric element 2 is polarized in the lateral direction (indicated by arrow P) in FIG. 9A of the ink pressure chamber 1.

When printing, an electric field is applied in the direction perpendicular to the direction of the polarization. The applied electric field causes deformation of the walls, so that a very small amount of ink, i.e., an ink drop, is ejected out through the nozzle hole 6 from the ink pressure chamber 1.

Specifically, application of a voltage to the walls 3*a* as shown in FIG. 9B, causes an electric field to be developed in the direction of the arrows. The walls 3*a* are deformed to extend outwardly relative to the chamber 1, causing the volume of the chamber 1 to increase. The increased volume results in a decrease in pressure in the chamber 1. Thus, ink 5 is supplied to the chamber 1 from a main ink-supplying system, not shown, by the amount of increased volume. Then, the direction of the electric field is reversed as shown in FIG. 9C. The walls 3*a* are deformed to extend inwardly relative to the chamber 1, causing an increase in the pressure of the chamber 1. The increased pressure causes an ink drop to be ejected through the nozzle hole 6 in the nozzle plate 4.

Finally, the respective walls 3*a* regain their original positions as shown in FIG. 9D, so that the ink drop 5*a* is separated from the ink in the chamber and is ejected from the nozzle hole 6, with the ink drop adhering to a print medium, not shown, to form a dot.

In manufacturing the aforementioned piezoelectric type print head, a plurality of grooves are formed in the two-layer piezoelectric element 2 to define a plurality of walls 3*a* and 3*b* as shown in FIG. 10A. Then, a cover 9 is bonded to the top surfaces (hatched areas in FIG. 10A) of the walls 3 using an adhesive 8 as shown in FIG. 10B, thereby defining ink pressure chambers 1. The walls 3*b* at ends of the row of the walls are thicker than the rest of walls 3*a* so as to protect thin walls 3*a* from inadvertently exerted outside forces.

Screen printing is widely used to apply the adhesive 8 on the top surface of the walls 3*a* and 3*b*.

As shown in FIG. 11A, a screen mask 11 is set in position in proximity to the top surfaces of the walls 3*a*–3*b*. The screen mask 11 has a pattern 12 in which mesh-like openings are formed, and the adhesive 8 is squeezed through the mesh-like openings. A predetermined amount of adhesive 8 is placed on one end of the pattern 12 as shown in FIG. 11B.

As shown in FIG. 11C, a squeegee 13 of the screen printer is first positioned in contact with the mask surface beside the adhesive 8, and then the squeegee 13 is caused to slide along the mask surface in the direction shown by an arrow as shown in FIG. 11D. The squeegee 13 travels while urging the adhesive 8 against the screen mask 11, and therefore the adhesive 8 is squeezed through the mesh-like openings to the top surfaces of the walls 3*a*–3*b* as shown in FIG. 11D. FIG. 11E shows the adhesive applied to the walls.

In the aforementioned prior art method, the adhesive 8 is transferred to the top surfaces of the walls 3*a*–3*b* by moving the squeegee 13 longitudinally of the walls along the grooves. Although each wall receives adhesive evenly applied along its length, the thickness of layer of the adhesive varies from wall to wall as shown in FIG. 12 due to slight differences in pressure applied to the adhesive across the width of the squeegee, and to variations in the contact condition between the squeegee and the screen mask 12.

Variations in the thickness of the adhesive layer result in poor bonding effect between the walls 3*a*–3*b* and the cover 9, which in turn causes differences in the amount of deformation of walls 3*a*–3*b* during printing operation. This causes variations in the amount of the ink discharged from the nozzle hole 6, leading to poor print quality. Moreover, there is a possibility of ink leaking through a portion to which insufficient adhesive is applied.

In addition, the same thickness of layer of adhesive 8 is applied to the top surfaces of all the walls 3*a*–3*b* across the length thereof as shown in FIG. 13A, and therefore the two walls 3*b* at extreme ends of row of walls 3*a*–3*b* receive more adhesive than the rest of walls since the two extreme walls 3*b* are thicker than the others. The grooves defined by the two extreme end walls 3*b* may be filled with an extra amount of adhesive as shown in FIG. 13B when the cover 9 is pressed against the walls 3*a*–3*b*. The adhesive leaked to fill in the groove suppresses deformation of the walls defining the groove, substantially deteriorating the function of pressurizing the ink in the chamber.

The adhesive 8 takes the form of, for example, an electrically conductive epoxy adhesive which contains electrically conductive particles having a size of about eight microns. The excessive adhesive entering the chamber may contact the adjacent electrode, short-circuiting each other.

One prior art method suggests providing several dummy grooves beside the piezoelectric element 2 in order to accommodate an extra amount of adhesive 8 when the cover 9 is pressed against the top surfaces of the walls. This method necessitates formation of extra grooves which impose additional manufacturing cost but do not serve to discharge ink.

SUMMARY OF THE INVENTION

An object of the invention is to provide a print head in which the adhesive is prevented from being pressed into the ink pressure chambers.

Another object of the invention is to provide a print head in which variation in deformation of the respective walls defining ink pressure chambers is reduced, thereby ensuring discharge of a uniform amount of ink from the respective ink pressure chambers for high quality print.

The present invention is directed method of manufacturing a print head for use with an ink jet printer. The print head includes a plurality of parallel ink pressure chambers defined by a plurality of walls and a cover bonded on the top surfaces of the walls. The method includes:

forming a plurality of parallel grooves in a piezoelectric element, the grooves being bounded by a plurality of parallel walls aligned in a row; and applying an adhesive either to the top surfaces of the walls or to a surface of a cover by screen printing, the adhesive being applied by moving a squeegee in a direction perpendicular to directions in which the walls extend; and placing a cover on the top surfaces of the walls so as to close the grooves to form the ink pressure chambers.

BRIEF DESCRIPTION OF THE DRAWINGS

FIGS. 9A–9H illustrate how the ink pressure chamber operates to discharge the ink therein.

DESCRIPTION OF THE PREFERRED EMBODIMENTS

Embodiments of the invention will now be described with reference to the drawings. Elements corresponding to those in the aforementioned prior art print head have been given like numerals and the description thereof has been omitted.

First embodiment

Figure 1A:
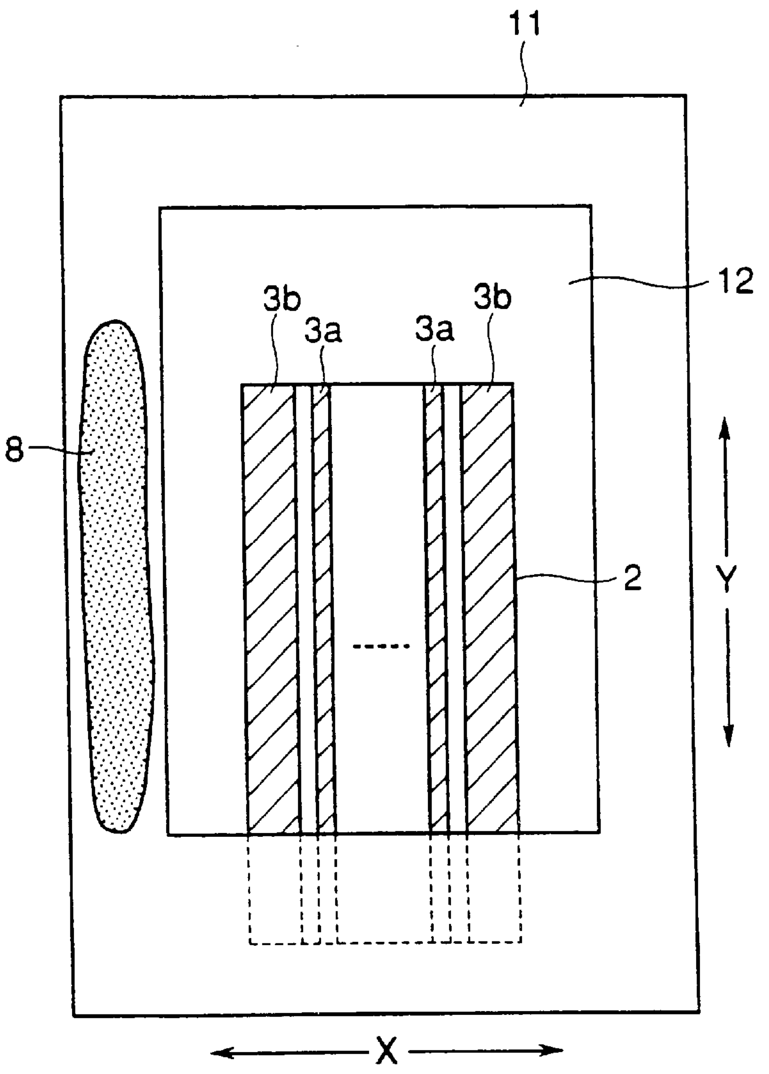
FIGS. 1A–1B illustrate a first embodiment of a method of manufacturing a print head according to the invention, FIG. 1A showing the top view and FIG. 1B showing a side view.
Figure 1B:
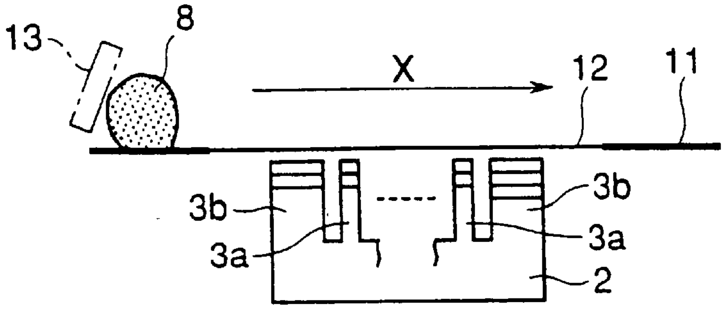

FIGS. 1A–1B illustrate a first embodiment of a method of manufacturing a print head according to the invention, FIG. 1A showing the top view and FIG. 1B showing a side view. A piezoelectric element 2 is formed with a plurality of grooves therein defined by walls 3*a* and 3*b*. The groove has a width of about 85 microns. In the first embodiment, an adhesive is applied to the top surfaces of the walls 3*a*–3*b* of the piezoelectric element 2 by screen printing, before bonding the piezoelectric element 2 and the cover together to close the upper openings of the grooves formed in the piezoelectric element 2.

Figure 1C:
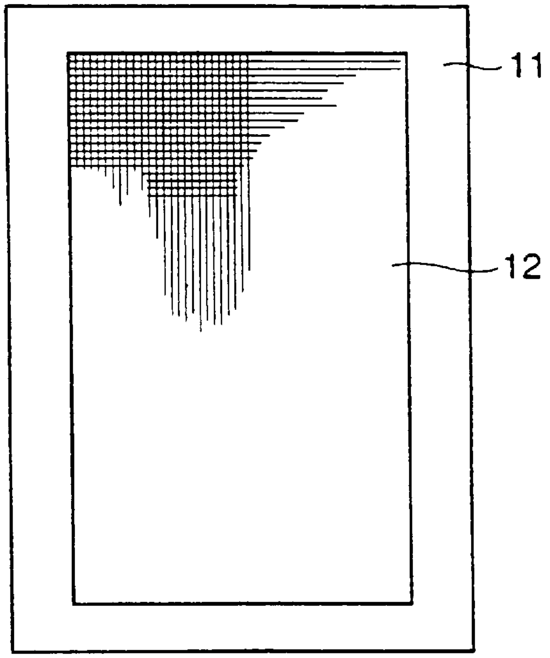
FIG. 1C illustrates a screen mask.

Referring to FIGS. 1A and 1B, a piezoelectric element 2 is disposed under the screen mask 11 in which a pattern 12 is formed. The pattern 12 is an area in which mesh-like openings are formed as shown in FIG. 1C. The thickness of the screen mask 11 is selected to be generally in the range from 5 to 36 microns, preferably in the range of 5 to 10 microns, taking the thickness of the applied adhesive layer into account. In the present embodiment, the screen mask 11 has a thickness of 36 microns for sufficient mechanical strength. The screen mask 11 may take the form of a sheet of stainless steel which has been etched to have mesh-like openings through which the adhesive passes, or a fabric of polyethylene terephthalate resin fiber on which masking-resin is applied to form a mask around the pattern 12. The size of mesh-like openings is selected to be larger than the electrically conductive particles contained in the adhesive.

The mesh-like openings are formed at intervals such that a sufficient amount of the adhesive can be applied to the top surface of each wall.

The screen mask 11 and piezoelectric element 2 are registered with each other so that the top surfaces of the walls 3*a*–3*b* are directly under the mesh-like openings. The adhesive is not applied to areas depicted by dotted lines in FIG. 1A since these areas are electrically connected to a flexible cable at a later manufacturing stage.

Figure 1D:
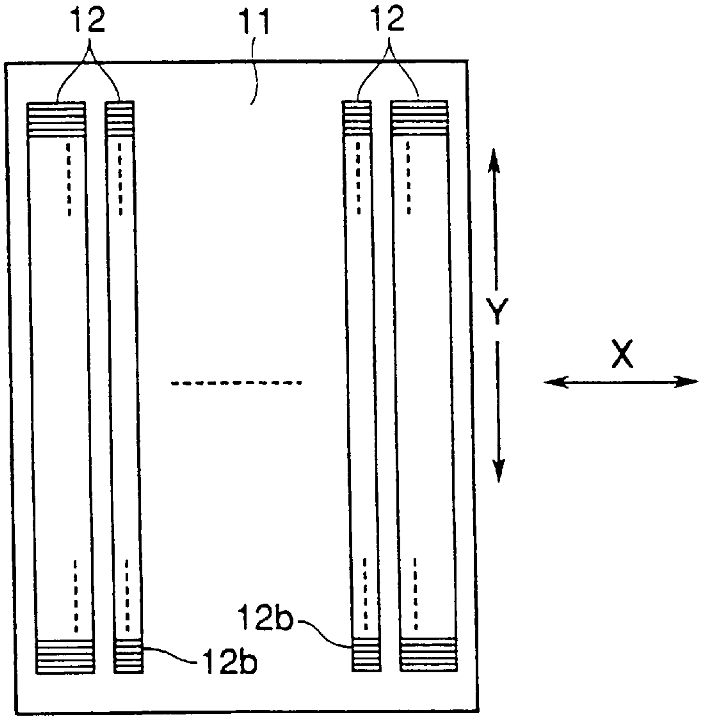
FIG. 1D illustrates another example of a screen mask having elongated mesh-like openings.

FIG. 1D shows a modification of the screen mask 11 having patterns 12 arranged in alignment with the walls of the piezoelectric element 2. Each of the patterns 12 may be formed so that each mesh-like opening 12*b* extends in the direction shown by X in which the squeegee 13 travels. Such orientation of the openings facilitates passage of the adhesive through the openings, ensuring application of the adhesive. The material which forms openings extending in the X direction, may seem to be apt to deform in the direction shown by Y in which the walls extend. However, the squeegee 13 is moved only in the X direction and therefore the force which may act on the mesh in the Y direction is not significant. Even if the adhesive 8 is squeezed out in the Y direction due to deformation of the screen mask in the Y direction, the adhesive will not enter the ink pressure chamber. Since the patterns 12 are arranged in alignment with the layout of the walls 3*a* and 3*b* of the piezoelectric element 2, the position of the pattern 12 relative to the walls 3*a* and 3*b* must be more closely aligned if the screen mask 11 shown in FIG. 1D is used.

The piezoelectric element 2 is disposed so that the squeegee 13 of the screen printer travels in a direction, shown by X, perpendicular to the direction Y in which the grooves and walls extend. Thus, the adhesive being applied extends in the direction X perpendicular to the direction Y as the squeegee 13 travels in the direction shown by X.

The first aspect of the invention will be described in more detail. A predetermined amount of adhesive 8 is supplied to one end of the screen mask 11 as shown in FIG. 1A so that the predetermined amount of adhesive 8 extends parallel to the grooves and walls. The screen mask 11 has a pattern 12 with regularly formed openings shown in FIG. 1C.

Figure 2A:
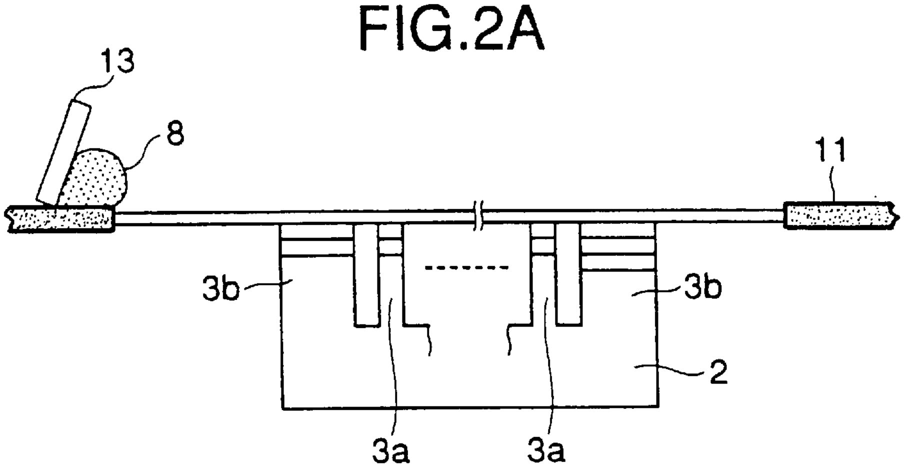
FIGS. 2A–2C illustrate how the adhesive is applied to the walls in the first embodiment.

As shown in FIG. 2A, the squeegee 13 of the screen printer is placed beside the adhesive 8, being in contact with the surface of the screen mask 11. The location of the squeegee 13 is referred to as "start position" in this specification.

Then, the squeegee 13 is caused to move along the mask surface in the direction X.

Figure 2B:
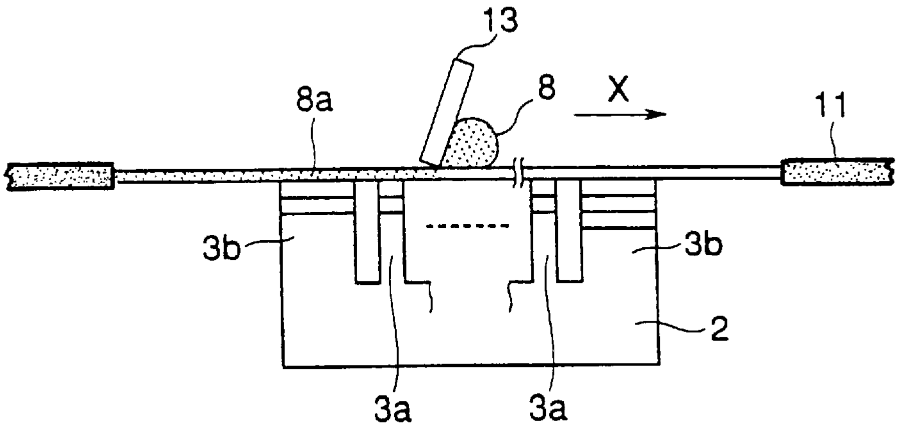
Figure 2C:
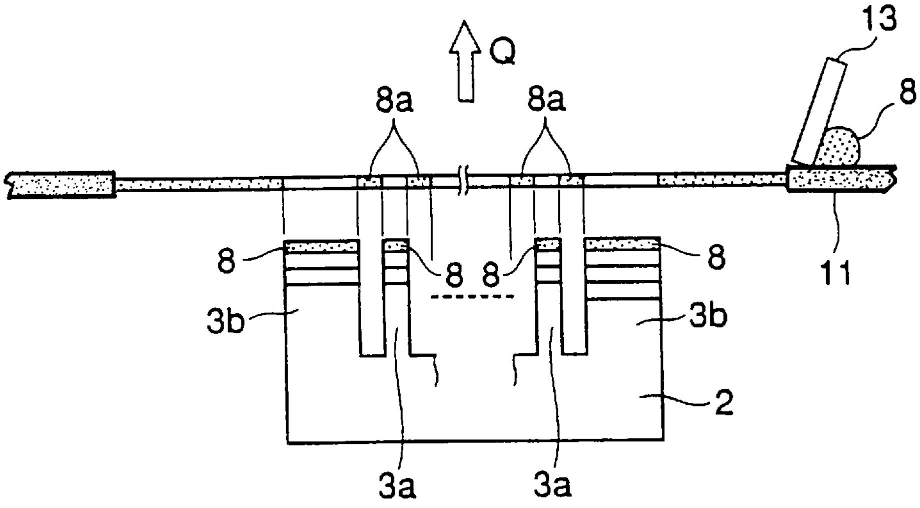

As the squeegee 13 moves along the mask surface, a portion of the adhesive is squeezed into the very small mesh-like openings of the screen to the top surfaces of the walls 3*a*–3*b* as shown in FIG. 2B. The adhesive having been squeezed into the very small mesh-like openings in areas directly over the top surfaces of the walls 3*a*–3*b*, is stuck to the top surfaces, while the adhesive having been squeezed into the mesh-like openings in areas directly over the grooves is held in the mesh-like openings. The mask screen is then lifted from the piezoelectric element 2. When the mask screen is lifted, the adhesive in areas directly over the top surfaces of the walls 3*a* and 3*b* remain stuck thereto, and is thereby transferred to the top surfaces of the walls while the adhesive in areas 8*a* directly over the grooves continues to be held in the pattern as shown in FIG. 2C. Then, a cover is placed on the top surfaces of the walls 3*a*–3*b*, so that the cover closes the respective grooves to form ink pressure chambers.

The first embodiment is effective in accommodating variations in pressure applied by the squeegee 13 to the adhesive 8 and differences in condition in which the squeegee contacts with the screen mask 11, so that a uniform amount of adhesive is applied to all of the top surfaces of the walls. For example, when the squeegee has some shallow dents in its edge in contact with the pattern, the thickness of applied adhesive layer will be different from that resulting from the other part of the squeegee 13. If the squeegee having such shallow dents is moved in the direction X perpendicular to the direction of walls, the applied adhesive layer will have variations in thickness only on part of the top surfaces of the walls. In contrast, if the squeegee 13 is moved as in the prior art in the direction Y in which the walls extend, the walls immediately under the shallow dents will have thicknesses of adhesive layer all across their length different from other walls. Thus the present invention is very effective in applying an adhesive with a uniform thickness.

Figure 2D:
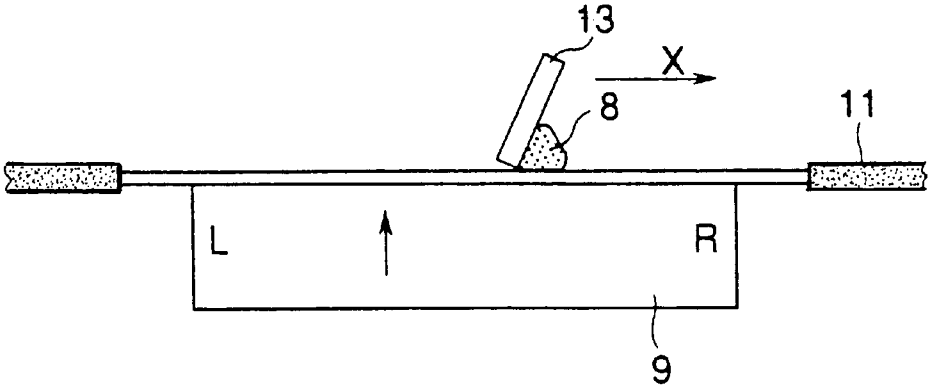
FIGS. 2D–2F illustrate how the adhesive is applied to the cover in the first embodiment.
Figure 2E:
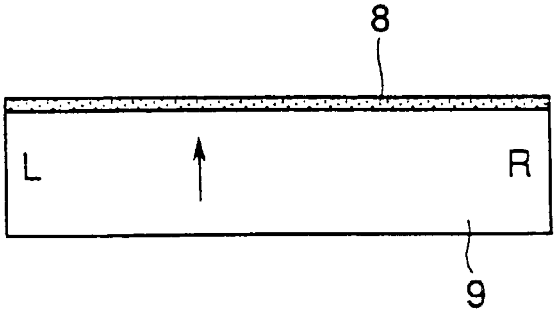
Figure 2F:
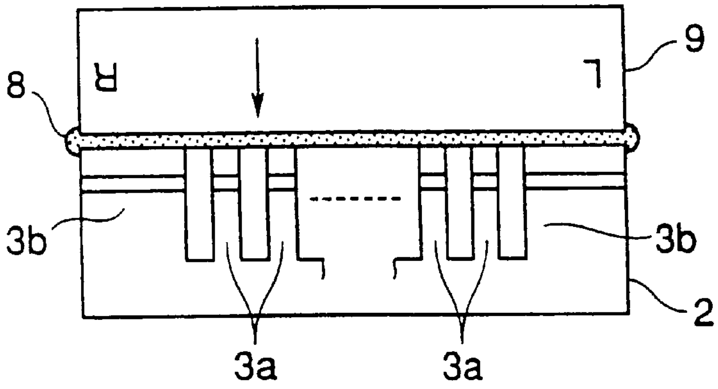

Although the first embodiment has been described with reference to the adhesive 8 applied to the top surfaces of the piezoelectric element 2 to which the cover is to be bonded, the adhesive 8 may be applied to the cover 9 instead of the piezoelectric element 2 for the same result. The adhesive 8 is applied by screen printing as shown in FIG. 2D to the cover 9 so that the entire area of the cover 9 is uniformly covered by the adhesive. The squeegee 13 is also moved in the direction shown by X in FIG. 1A. In other words, the squeegee 13 is moved in such a direction that upon mounting the cover 9 on the piezoelectric element 2, the walls 3*a* and 3*b* will extend in the direction perpendicular to the direction of movement of the squeegee 13. Then, the cover is placed on the piezoelectric element 2 to close the grooves as shown in FIG. 2F. When the adhesive is applied to the cover 9, the adhesive appears directly above the grooves as shown in FIG. 2F but the adhesive is kept stuck to the cover, and will not enter the grooves.

Second embodiment

A second embodiment of a method of manufacturing a print head will be described with reference to FIGS. 3A–3B and 4A–4B.

Figure 3A:
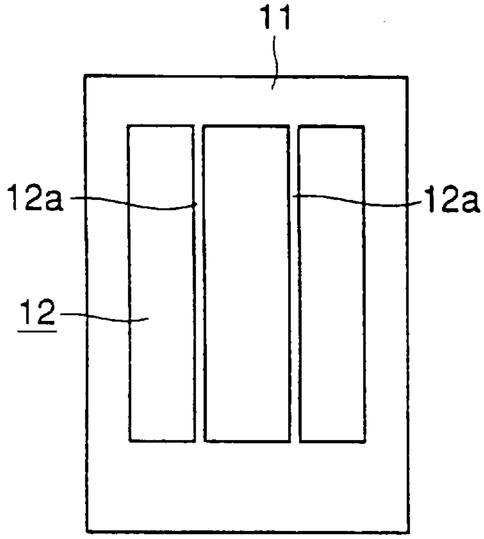
FIGS. 3A–3B illustrate a second embodiment, FIG. 3A showing the top view of a screen mask and FIG. 3B showing the screen mask as being placed on a piezoelectric element.

An adhesive 8 is applied to, for example, a piezoelectric element 2 using a screen mask 11 as shown in FIG. 3A prior to bonding the piezoelectric element and a cover together.

Figure 3B:
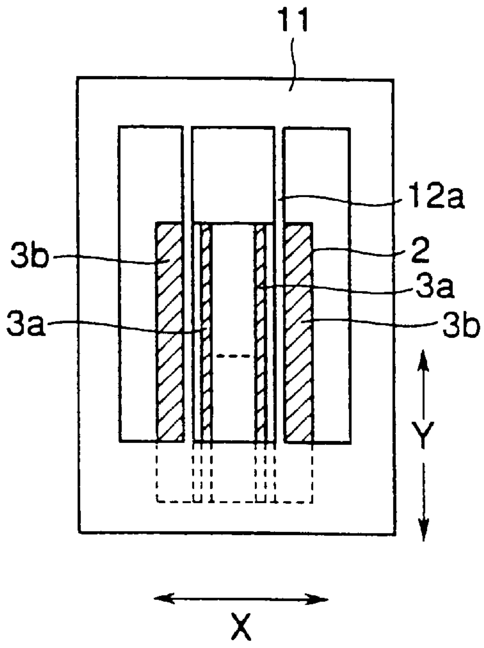

The pattern 12 has a shield 12*a* aligned with a part of each of thick walls 3*b* located at extreme ends of the row of walls 3*a*–3*b*, so that the shield 12*a* prevents the adhesive from being applied to a predetermined area of the top surface of the thick wall 3*b*. Referring to FIG. 3B, the shield 12*a* covers a part of the top surface of the wall immediately adjacent the chamber, and extends parallel to the chamber.

Figure 4A:
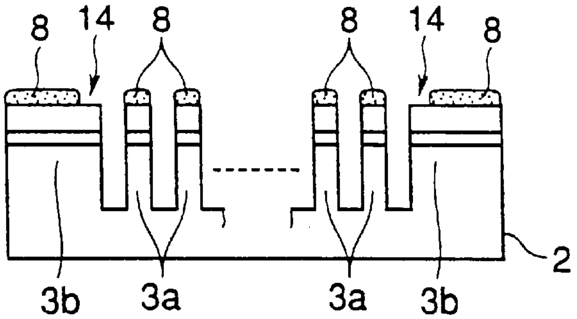
FIG. 4A illustrates a piezoelectric element of the second embodiment shortly after the adhesive is applied thereon.
Figure 4B:
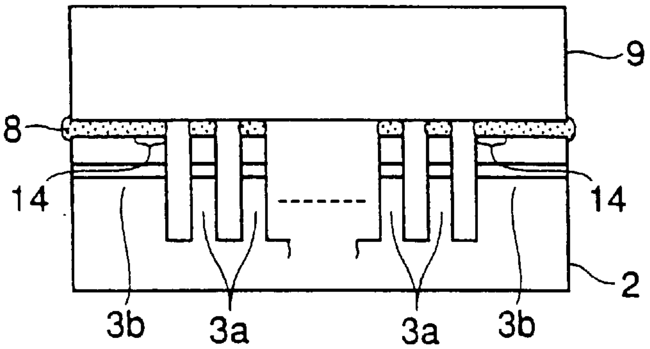
FIG. 4B illustrates a piezoelectric element after the cover is placed on the piezoelectric element in FIG. 4A.

Upon completing the application of the adhesive, the adhesive 8 squeezed through the mesh-like openings of the screen mask 11 appear on the top surfaces of the respective walls 3*a*–3*b* as shown in FIG. 4A except for a predetermined surface area 14 of the thick wall 3*b* at each extreme end of the row of the walls 3*a*–3*b*. This area 14 serves to accommodate an excessive amount of adhesive. The cover 9 is then pressed against the piezoelectric element to close the chamber, so that an excessive portion of the adhesive deposited on the top surface of the extreme wall 3*b* spreads into the area 14. The size of the area 14 may be preselected so that the excessive portion of the adhesive spreads just enough to cover the area 14, thereby preventing the adhesive from entering the chambers formed at the extreme ends of the row of the walls.

Figure 5A:
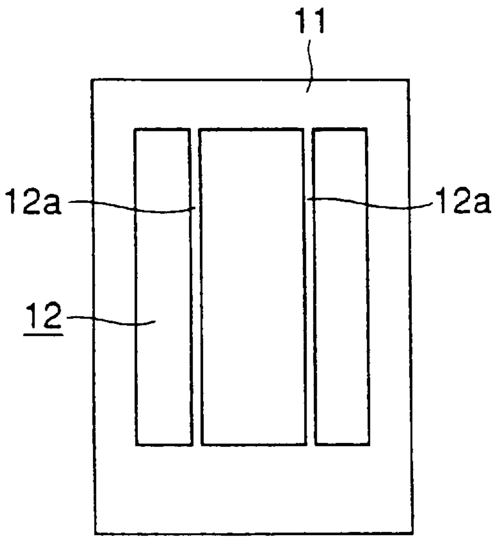
FIGS. 5A–5B illustrate a modification of the second embodiment, FIG. 5A showing the top view of a screen mask and FIG. 5B showing the screen mask placed on a piezoelectric element.

FIGS. 5A–5B and 6A–6B illustrate a modification of the second embodiment in which a screen mask 11 as shown in FIG. 5A is used.

The screen mask 11 also has a shield 12*a* aligned with each of thick walls 3*b* located at extreme ends of the row of walls 3*a*–3*b*, so that the shield 12*a* prevents the adhesive from being applied to a predetermined area 14 of the top surface of the thick wall 3*b* Just as in the second embodiment shown in FIGS. 3A–3B. It is to be noted that the shield 12*a* is located away from the chamber by a distance W equal to the thickness W of the thin wall 3*a*.

Figure 5B:
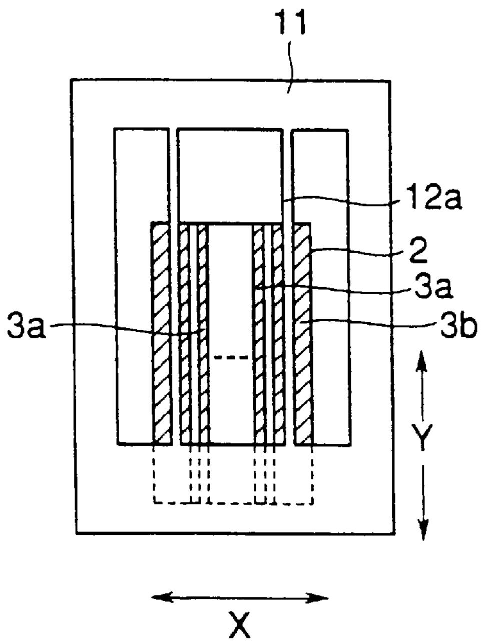
Figure 6A:
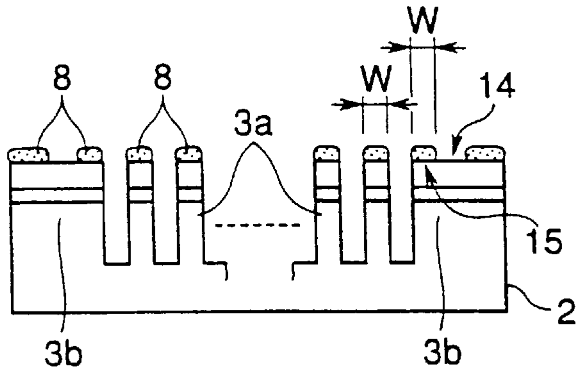
FIG. 6A illustrates a piezoelectric element according to a modification of the second embodiment of FIGS. 5A-5B, showing the piezoelectric element shortly after the adhesive is applied thereon.

As shown in FIG. 5B, when the piezoelectric element 2 is placed under the screen mask 11 in registration with the screen mask, the shield 12 is away from the chamber by a distance W equal to the thickness W of the thin wall 3*a*, and shields the predetermined surface area 14 extending in parallel with the chamber. Thus, the adhesive 8 is applied to the top surface of the thick wall 3*b* except for the area 14 under the shield 12 as shown in FIG. 6A. The cover 9 is then pressed against the piezoelectric element 2 to close the chambers.

Figure 6B:
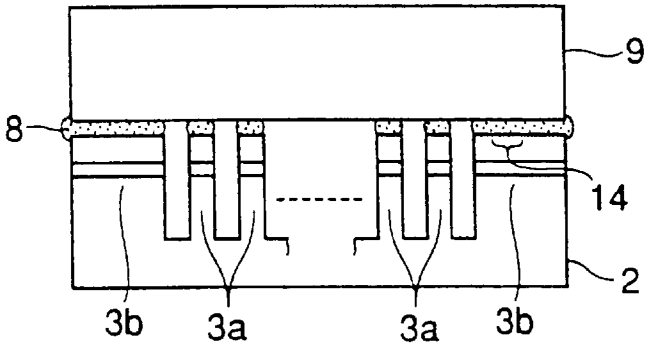
FIG. 6B illustrates a piezoelectric element after the cover is placed on the piezoelectric element in FIG. 6A.

Thus, as shown in FIG. 6B, when the cover 9 is pressed against the piezoelectric element 2 to close the chambers, an excessive portion of the adhesive 8 on the top surface of the extreme wall 3*b* spreads into the area 14. Since the shield 12*a* is away from the chamber by a distance W equal to the thickness W of the thin walls 3*a*, the amount of the adhesive that is excessive and spreads out can be made even between walls 3*b* and 3*a*.

Third embodiment

Figure 7A:
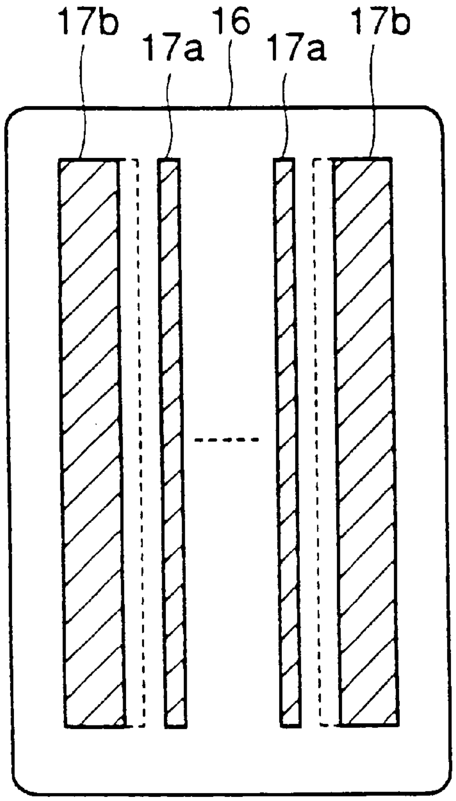
FIGS. 7A–7C illustrate a third embodiment, FIG. 7A showing the top view of an adhesive sheet, FIG. 7B showing the adhesive sheet as being placed on a piezoelectric element, and FIG. 7C showing the piezoelectric element shortly after the adhesive is applied thereon.

The adhesive is applied to the piezoelectric element by screen printing in the second embodiment and its modification. However, an adhesive sheet may also be used instead of screen printing in applying an adhesive to either the piezoelectric element or the cover. In the third embodiment, an adhesive sheet 16 is provided with a row of thin layers 17*a* and 17*b* of adhesive. The layer at each extreme end of the row, which corresponds to the thick wall 3*b*, has a width narrower than the thickness of the wall 3*b* by a certain distance indicated in a dotted line in FIG. 7A.

Figure 7B:
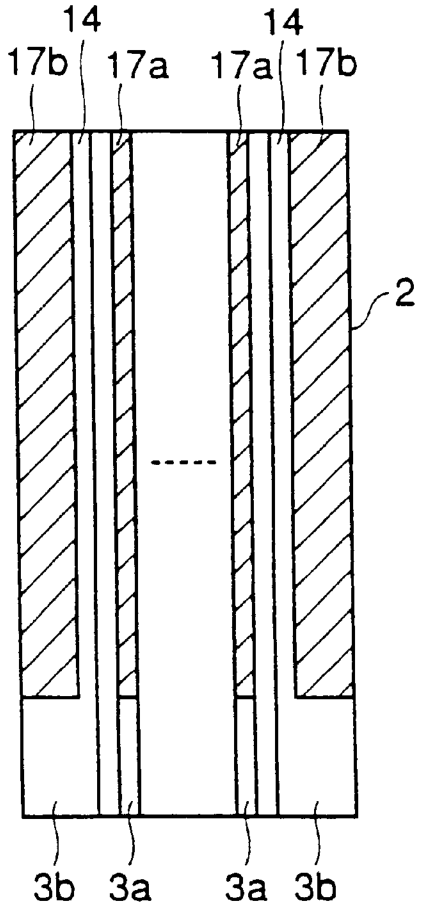
Figure 7C:
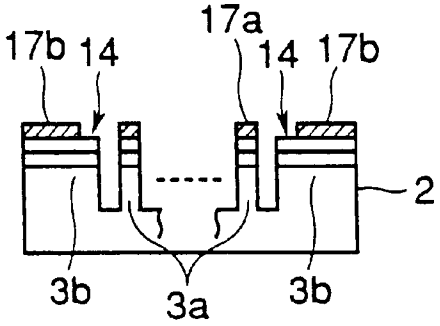

The adhesive sheet 16 is placed on the piezoelectric element 2 so that the thin layers 17*a* and 17*b* adhere to the corresponding top surfaces of the walls 3*a* and 3*b* as shown in FIGS. 7B–7C. When the thin layers 17*a*–17*b* are pressed against the top surfaces of the walls 3*a*–3*b*, the adhesive is deposited on the top surface of the thick wall 3*b* except for an area 14 extending in parallel with the thick wall 3*b*. Thus, the adhesive sheet method prevents an extra amount of adhesive from filling the chamber space Just as in the screen printing.

The use of the adhesive sheet eliminates variations in the amount of adhesive applied to the top surfaces of the walls which result from, for example, the variations in the size of mesh-like openings, and provides uniform thickness of the layer of the applied adhesive. Thus, the adhesive sheet method allows precise, accurate adhesion of the adhesive and simplifies the adhering operation for a cost saving.

Figure 8A:
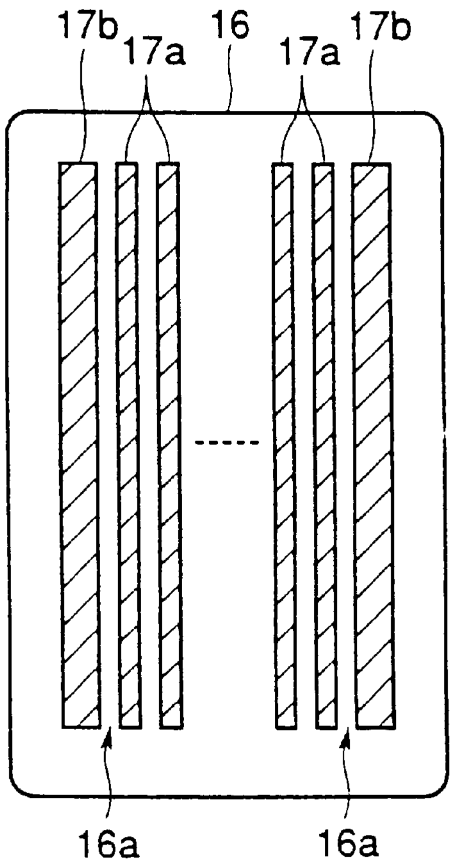
FIGS. 8A–8C illustrate a modification of the third embodiment, FIG. 8A showing the top view of an adhesive sheet, FIG. 8B showing the adhesive sheet as being placed on a piezoelectric element, and FIG. 8C showing the piezoelectric element shortly after the adhesive is applied thereon.
Figure 8B:
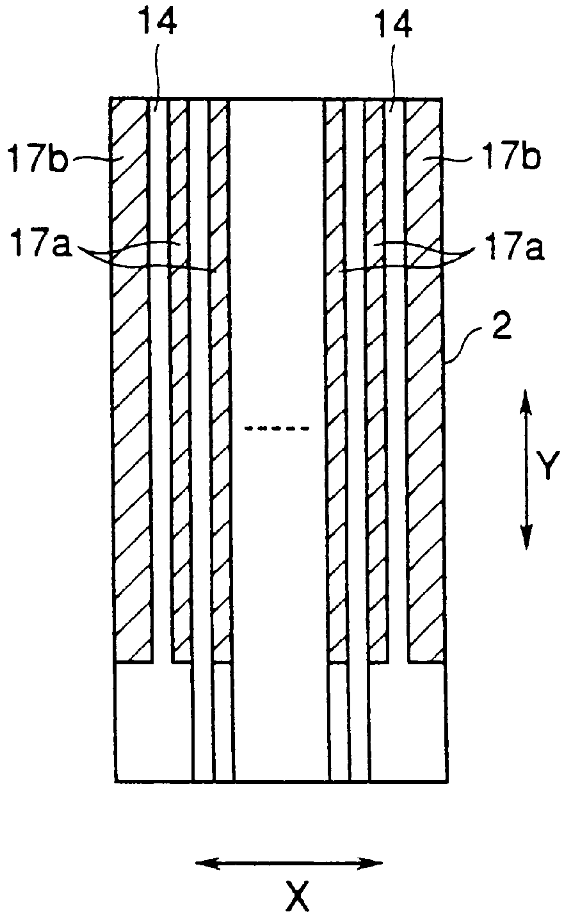
Figure 8C:
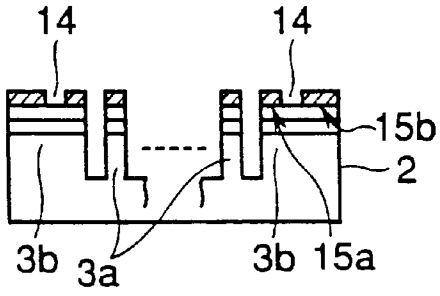
Figure 10A:
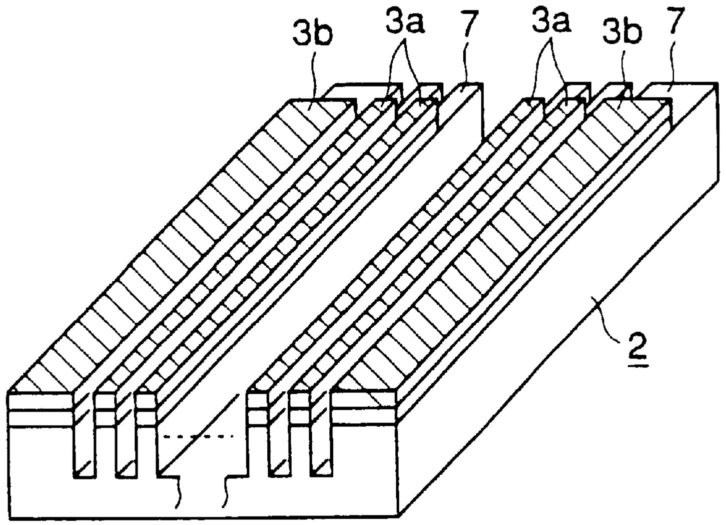
FIGS. 10A–10B illustrate how a print head is manufactured.
Figure 10B:
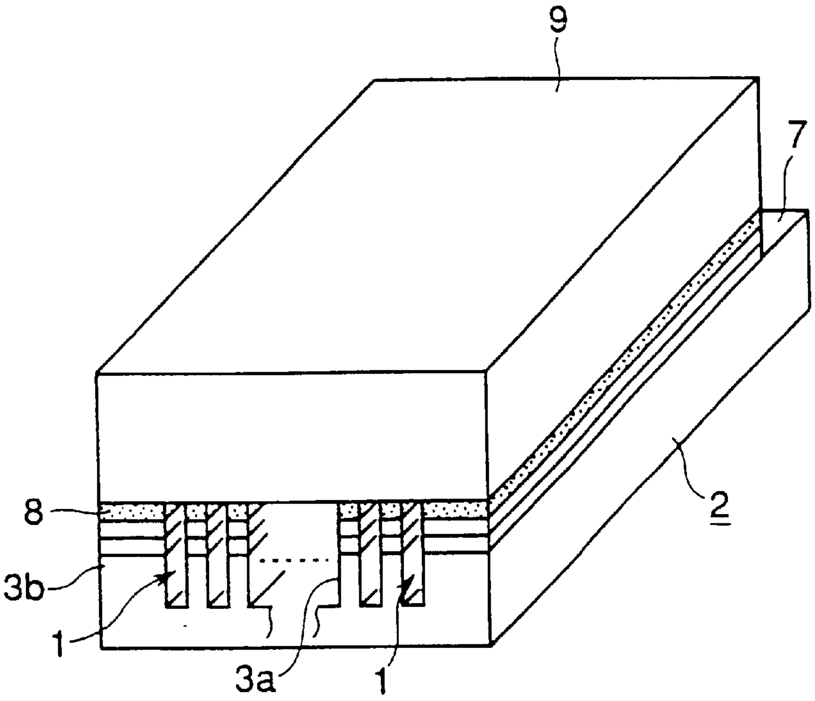
Figure 11A:
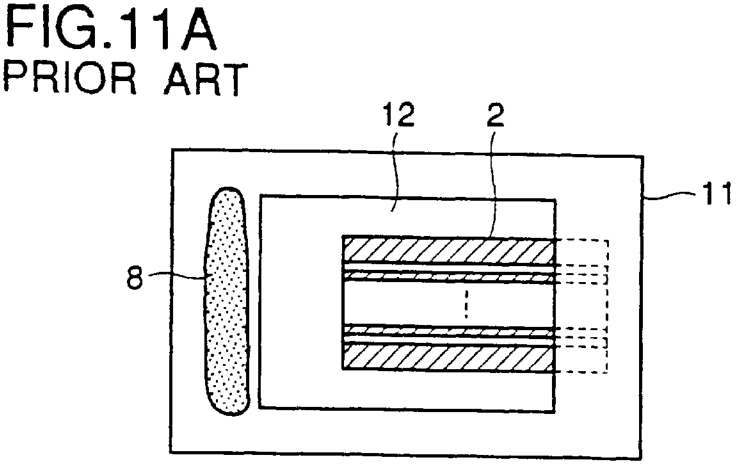
FIG.11A PRIOR ART
FIGS. 11A–11E illustrate a prior art method of applying an adhesive to a piezoelectric element.
Figure 11B:
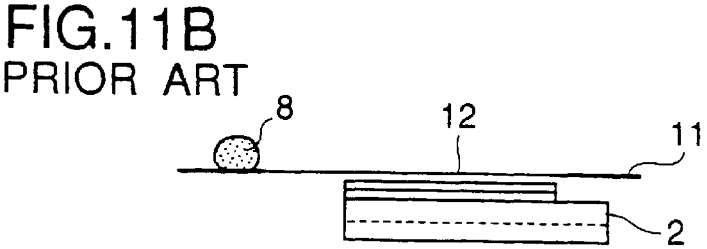
FIG.11B PRIOR ART
Figure 11C:
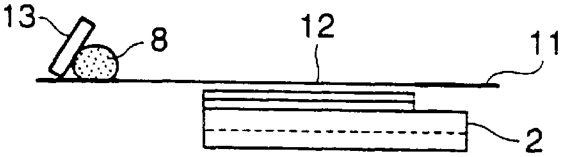
FIG.11C PRIOR ART
Figure 11D:
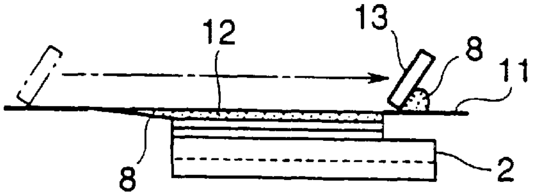
FIG.11D PRIOR ART
Figure 11E:
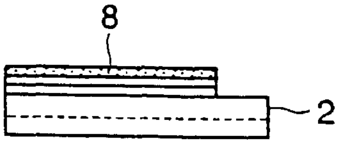
FIG.11E PRIOR ART
Figure 12:
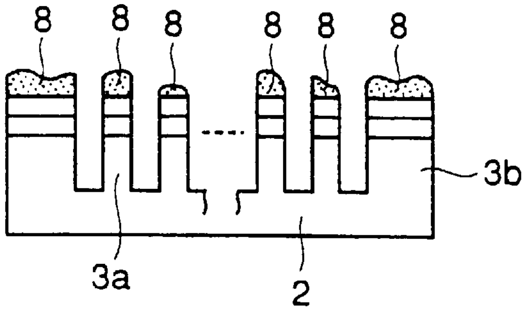
FIG.12 PRIOR ART
FIG. 12 illustrates a drawback of the prior art method shown in FIGS. 11A–11E.
Figure 13A:
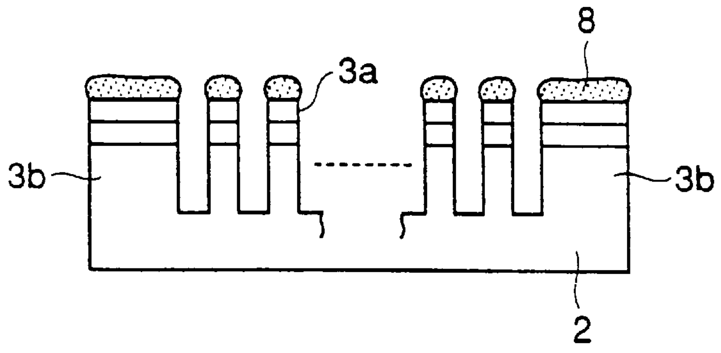
FIG.13A PRIOR ART
FIGS. 13A–13B illustrate another drawback of the prior art method shown in FIGS. 11A–11E.
Figure 13B:
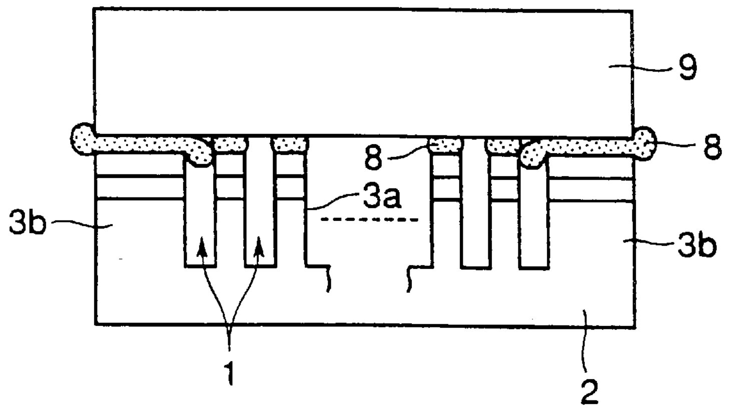
FIG.13B PRIOR ART

FIG. 8A shows another example of using the adhesive sheet method. The adhesive sheet 16 is provided with areas 16*a* in which the adhesive is not applied. The area 16*a* extends parallel to the thick wall 3*b*, dividing the thin layer of adhesive into two parallel layers 17*a* and 17*b*. The width of the layer 17*a* is the same as the thickness of the thin wall 3*a*. The adhesive sheet 16 is placed on the piezoelectric element 2 with the areas 16*a* and layers 17*a*–17*b* in registration with the layout of the walls as shown in FIG. 8B, so that the thin layers 17*a* and 17*b* adhere to the corresponding top surfaces of the walls 3*a* and 3*b* as shown in FIG. 8C. Thus, the adhesive is deposited on the top surfaces 15*a* and 15*b* of the thick wall 3*b* except for the area 14 extending in parallel with the thick wall 3*b*. The adhesive sheet method is also effective in making the amount of excessive adhesive even between the walls 3*a* and 3*b*.

The adhesive may also be applied by spraying after masking in stead of using an adhesive sheet.

When applying the adhesive 8 to both the cover 9 and the piezoelectric element 2, the aforementioned advantage of being able to prevent excessive amount of adhesive from entering the grooves can also be obtained by appropriately arranging the locations at which the adhesive 8 is applied. This can be achieved by designing the shape of the pattern 12 of the screen mask 11 and the adhesive thin layer in such a way that the area 14 is provided on the top surface of the extreme wall 3*b*.

What is claimed is:

1. A method of manufacturing a print head for use with an ink jet printer, the print head having a plurality of parallel ink pressure chambers each of which is defined by adjacent walls, and having a cover bonded on top surfaces of the walls, comprising:

forming a plurality of parallel grooves in a surface of a piezoelectric element, and a plurality of parallel walls aligned in a row, each of said grooves being bounded by adjacent ones of the parallel walls;

applying an adhesive either to said top surfaces of the plurality of walls or to a surface of a cover by screen printing, said adhesive being applied by moving a squeegee in a direction essentially only perpendicular to directions in which the walls extend; and placing said cover on said top surfaces of the walls so as to close said grooves to form the ink pressure chambers.

2. The method according to claim 1, wherein said applying an adhesive includes:

applying the adhesive by screen printing using a pattern formed in a screen, the pattern extending parallel to each of the top surfaces, and including a plurality of openings aligned in a direction in which the pattern extends, each of the openings being elongated in a direction in which the squeegee is moved.

3. The method according to claim 1, wherein said plurality of walls include two end walls each of which is at a respective end of the row of said plurality of walls, and a plurality of intermediate walls between said end walls, said end walls having a thickness greater than that of said intermediate walls; and said applying an adhesive includes:

applying the adhesive to a top surface of each of said end walls except for a respective predetermined area on said top surface thereof, each of said predetermined areas on each respective end wall extending in a direction in which said end walls extend.

4. The method according to claim 3, wherein said applying an adhesive includes:

applying the adhesive to the top surface of each of said end walls except for the predetermined areas, said predetermined areas extending longitudinally of each of said end walls, and each respective predetermined area being immediately adjacent to a respective groove defined by said respective end wall.

5. The method according to claim 3, wherein said applying an adhesive includes:

applying the adhesive to the top surface of each of said end walls except for the predetermined areas, said predetermined areas extending longitudinally of said end walls, and each respective predetermined area being between two areas on the respective top surface of each respective end wall, said two areas extending longitudinally of each of said end walls.

6. A method of making a print head, comprising:

providing a piezoelectric element having at least one groove formed therein, the at least one groove extending in a first direction; and applying an adhesive to a top surface of the piezoelectric element and in a region of the groove by moving a squeegee only in a second direction essentially perpendicular to the first direction.

7. A method of making a print head, comprising:

providing a piezoelectric element having at least one groove formed therein, the at least one groove extending in a first direction;

applying an adhesive to a surface of a cover by moving a squeegee only in a second direction; and placing the cover over the piezoelectric element and the at least one groove, so that the second direction is essentially perpendicular to the first direction.

* * * * *